(12) United States Patent
Lin et al.

(10) Patent No.: US 8,767,360 B2
(45) Date of Patent: Jul. 1, 2014

(54) ESD PROTECTION DEVICE FOR CIRCUITS WITH MULTIPLE POWER DOMAINS

(75) Inventors: Ying-Chang Lin, Singapore (SG); Da-Wei Lai, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 123 days.

(21) Appl. No.: 13/482,413

(22) Filed: May 29, 2012

(65) Prior Publication Data

US 2013/0321961 A1     Dec. 5, 2013

(51) Int. Cl.
*H02H 9/00*        (2006.01)
(52) U.S. Cl.
USPC .......................................................... 361/56
(58) Field of Classification Search
USPC .......................................................... 361/56
See application file for complete search history.

(56) References Cited

U.S. PATENT DOCUMENTS

| 2006/0114047 A1* | 6/2006 | Irino .............................. 327/328 |
| 2007/0223163 A1* | 9/2007 | Hung et al. ................... 361/93.1 |
| 2012/0154961 A1* | 6/2012 | Russ et al. ....................... 361/56 |

* cited by examiner

*Primary Examiner* — Scott Bauer
(74) *Attorney, Agent, or Firm* — Ditthavong & Steiner, P.C.

(57) ABSTRACT

A ESD protection scheme is disclosed for circuits with multiple power domains. Embodiments include: coupling a first power clamp to a first power rail and a first ground rail of a first domain; coupling a second power clamp to a second power rail and a second ground rail of a second domain; providing a blocking circuit for blocking current from an ESD event; providing an I/O interface connection in the first domain for transmitting signals from the first domain to the blocking circuit; providing a core interface connection in the second domain for transmitting signals from the blocking circuit to the second domain; coupling an input connection of the blocking circuit to the I/O interface connection; and coupling an output connection of the blocking circuit to a core interface connection.

20 Claims, 5 Drawing Sheets

ESD PROTECTION DEVICE FOR CIRCUITS WITH MULTIPLE POWER DOMAINS

TECHNICAL FIELD

The present disclosure relates to electrostatic discharge (ESD) protection devices for circuits with multiple power domains. The present disclosure is particularly applicable to ESD protection devices for circuits utilizing advanced technology (e.g., semiconductor manufacturing processes of 28 nanometers (nm) and below).

BACKGROUND

Generally, integrated circuits will include multiple power domains. A device may, for instance, include an input/output (I/O) circuit along with a core circuit, each of which may be associated with a different power domain (e.g., the I/O circuit may be associated with a high voltage power domain, the core circuit may be associated with a low voltage power domain, etc.). Thus, signals may travel from a high voltage power domain to a low voltage power domain. From an ESD protection design point-of-view, one of the most critical issues of cross-domain interface circuits is gate oxide breakdown of low-voltage metal-oxide-semiconductor field-effect transistors (MOSFETs). Since the overall gate oxide breakdown voltage ($V_{BD}$) is decreasing in advancing technology, the margin, for instance, between $Vt_1$ (e.g., a trigger voltage) of an ESD grounded gate n-type MOS (ggNMOS) and $V_{BD}$ of a MOSFET gate oxide is rapidly diminishing.

FIG. 1 schematically illustrates a circuit that includes a traditional cross-domain ESD protection scheme. As shown, the circuit in FIG. 1 includes an I/O input terminal 101 connected to transistors 103 and 105, the drains of which are connected to the gates of transistors 107 and 109. Moreover, the circuit includes design paths 111a (e.g., from power rail 113 to ground rail 115 through clamp 117, ground rail 119, and diode 121) and 111b (e.g., from power rail 113 to power rail 123 through clamp 117, ground rail 119, diode 121, ground rail 115, and a parasitic diode of clamp 125) to enable ESD current to travel, for instance, from VDD1 to VSS2 and VDD1 to VDD2, respectively. Nonetheless, some ESD current may also travel along path 127 through transistor 103 to damage the gate oxide of transistor 109 (e.g., under VDD1 to VSS2 ESD zapping), and along path 129 through transistor 103 to damage the gate oxide of transistor 107 (e.g., under VDD1 to VDD2 ESD zapping).

FIG. 2 schematically illustrates a common solution for the problems of a traditional cross-domain ESD protection scheme. As shown, the circuit in FIG. 2 includes components similar to the components of the circuit in FIG. 1, such as transistors 201, 203, 205, and 207, power rails 209 and 211 (e.g., VDD1 and VDD2), ground rails 213 and 215 (e.g., VSS1 and VSS2), clamps 217 and 219, and diodes 221. To overcome some of the issues associated with the traditional cross-domain ESD protection scheme, the circuit in FIG. 2 further includes resistor 223, diode 225, and transistor 227 (e.g., a grounded gate transistor). Resistor 223 reduces the voltage drop between the gate and source of each of transistors 205 and 207, decreasing the likelihood of gate oxide damage to transistors 205 and 207 as a result of an ESD event (e.g., ESD zapping). Diode 225 protects transistor 205 (e.g., a PMOS transistor) from gate oxide breakdown during an ESD event from power rail 209 to power rail 211 (e.g., VDD1 to VDD2 ESD zapping). Transistor 227 protects transistor 207 (e.g., an NMOS transistor) from gate oxide breakdown during an ESD event from power rail 209 to ground rail 215 (e.g., VDD1 to VSS2 ESD zapping).

Although the ESD protection scheme of FIG. 2 may increase gate-oxide protection in mature technologies, the scheme still has several drawbacks. For example, although resistor 223 reduces the voltage drop between the respective gate and source of each of the transistors 205 and 207, the inclusion of resistor 223 in the circuit negatively impacts high-speed I/O application. In addition, leakage may occur through diode 225 during normal operations (e.g., leakage may occur when VDD1 is powered on before VDD2 is powered on). While a power-on sequence may be implemented to mitigate leakage, such a solution hinders flexibility associated with the circuit. Furthermore, while the addition of transistor 227 may protect transistor 207 from gate oxide breakdown in current technologies, such an approach will not be effective in further advanced technologies, since any margin, for instance, between $Vt_1$ of transistor 227 and $V_{BD}$ of the gate oxide of transistor 207 will practically be non-existent.

FIG. 3 schematically illustrates another solution for the problems of a traditional cross-domain ESD protection scheme. As shown, the circuit in FIG. 3 includes components similar to the components of the circuit in FIG. 1, such as transistors 301, 303, 305, and 307, power rails 309 and 311 (e.g., VDD1 and VDD2), ground rails 313 and 315 (e.g., VSS1 and VSS2), clamps 317 and 319, and diodes 321. To overcome some of the issues associated with the ESD protection schemes of FIGS. 1 and 2, the circuit in FIG. 3 includes resistors 323, 325, and 327, transistors 329 and 331, and source pump resistors 333 and 335. The addition of source pump resistors 333 and 335, for instance, further reduces the potential difference between the gate and source of each of the transistors 305 and 307, while the structure including resistor 327 and transistor 329 eliminates the need for a power-on sequence.

However, the ESD protection scheme of FIG. 3 also has several drawbacks. For example, as shown by indicator 337, transistor 331 may suffer false-triggering as a result of a noisy I/O ground rail 313 (e.g., simultaneous switching output and simultaneous switching noise (SSO/SSN)), resulting in distortion of the core output function. Moreover, the inclusion of source pump resistors 333 and 335 further reduces the speed of high-speed I/O applications and increases the design complexity of the circuit. In addition, the increase in the number of resistors (e.g., resistors 323, 325, and 327, and source pump resistors 333 and 335) results in more chip area required to implement the design, increasing the size of devices associated with such designs.

A need therefore exists for circuits with more effective ESD solutions, for instance, that complement high-speed I/O applications with minimal impact on device size, and enabling methodology.

SUMMARY

An aspect of the present disclosure is a circuit implementing an ESD protection device for blocking ESD discharge current between power domains.

Another aspect of the present disclosure is a method for implementing an ESD protection device for blocking ESD discharge current between power domains.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a circuit including: a first domain including a first power clamp coupled to a first power rail and a first ground rail, and a first interface connection configured to transmit signals from the first domain; a second domain including a second power clamp coupled to a second power rail and a second ground rail, and a second interface connection configured to receive signals into the second domain; and a blocking circuit for blocking current from an ESD event, the blocking circuit having an input connection coupled to the first interface connection and an output connection coupled to the second interface connection.

Aspects include a blocking circuit including: a first NMOS having a first NMOS gate, a first NMOS drain, and a first NMOS source coupled to a first ground rail; a second NMOS having a second NMOS gate, a second NMOS drain, and a second NMOS source coupled to the first ground rail; and an inverter having an input coupled to an input connection and the first NMOS gate, and having an output coupled to the second NMOS gate. Some aspects include a blocking circuit further including: a first core PMOS having a first core PMOS gate, a first core PMOS drain, and a first core PMOS source coupled to a second power rail; and a second core PMOS having a second core PMOS gate, a second core PMOS drain, and a second core PMOS source coupled to the second power rail, wherein a first NMOS drain is coupled to the first core PMOS drain and the second core PMOS gate, and wherein an output connection is coupled to the second core PMOS drain, a second NMOS drain, and the first core PMOS gate. Another aspect includes a second domain further including a core PMOS having a core PMOS gate, a core PMOS drain, and a core PMOS source coupled to a second power rail; and a core NMOS having a core NMOS gate coupled to the core PMOS gate and a second interface connection, a core NMOS drain coupled to the core PMOS drain, and a core NMOS source coupled to a second ground rail, wherein a first NMOS and an inverter have a gate oxide breakdown voltage greater than a gate oxide breakdown voltage of the core PMOS and the core NMOS, and wherein a first power rail has a voltage greater than the second power rail. Additional aspects include a circuit, wherein a first NMOS and an inverter have a gate oxide breakdown voltage of between 7 volts and 8 volts, and a core PMOS and a core NMOS have a gate oxide breakdown voltage of between 4 volts and 5 volts and between 3.5 volts and 4.5 volts, respectively, and wherein a first power rail has a voltage of 1.65 volts to 2 volts and a second power rail has a voltage of 0.8 volts to 1 volt. Further aspects include a circuit having a first RC clamp coupled to a first power rail and a first ground rail; and a diode having an anode coupled to the first ground rail and a cathode coupled to a second ground rail, wherein current from an ESD event is discharged on a path from the first power rail to the second ground rail via the first RC clamp and the diode. Some aspects include a circuit having a second RC clamp coupled to a second power rail and a second ground rail, wherein current from an ESD event is discharged on a path from a first power rail to the second power rail via a first RC clamp, a diode, and the second RC clamp. Additional aspects include a circuit, wherein no leakage current from a first power rail to a second power rail flows through a blocking circuit when the first power rail is energized before the second power rail.

An additional aspect of the present disclosure is a method including: coupling a first power clamp to a first power rail and a first ground rail of a first domain; coupling a second power clamp to a second power rail and a second ground rail of a second domain; providing a blocking circuit for blocking current from an ESD event; providing an I/O interface connection in the first domain for transmitting signals from the first domain to the blocking circuit; providing a core interface connection in the second domain for transmitting signals from the blocking circuit to the second domain; coupling an input connection of the blocking circuit to the I/O interface connection; and coupling an output connection of the blocking circuit to a core interface connection.

Some aspects include: providing in a blocking circuit a first NMOS transistor having a first NMOS source, a first NMOS drain, and a first NMOS gate; coupling the first NMOS source to a first ground rail; providing in the blocking circuit a second NMOS transistor having a second NMOS source, a second NMOS drain, and a second NMOS gate; coupling the second NMOS source to the first ground rail; providing an inverter in the blocking circuit; coupling an output of the inverter to the second NMOS gate; and coupling an input of the inverter to the first NMOS gate and an input connection. Other aspects include: providing in a blocking circuit a first core PMOS transistor having a first core PMOS source, a first core PMOS drain, and a first core PMOS gate; coupling the first core PMOS source to a second power rail; providing in the blocking circuit a second core PMOS transistor having a second core PMOS source, a second core PMOS drain, and a second core PMOS gate; coupling the second core PMOS source to the second power rail; coupling the first NMOS drain to the first core PMOS drain, and to the second core PMOS gate; and coupling the second NMOS drain to the second core PMOS drain, the first core PMOS gate, and to an output connection. Further aspects include: providing in a second domain a core PMOS transistor having a core PMOS source, a core PMOS drain, and a core PMOS gate, the core PMOS transistor having a gate oxide breakdown voltage less than a gate oxide breakdown voltage of a first NMOS and of an inverter; coupling the core PMOS source to a second power rail; providing in the second domain a core NMOS transistor having a core NMOS source, a core NMOS drain, and a core NMOS gate, the core NMOS transistor having a gate oxide breakdown voltage less than the gate oxide breakdown voltage of the first NMOS and of the inverter; coupling the core NMOS source to a second ground rail; coupling the core NMOS gate, the core NMOS gate and an output connection; and coupling the core NMOS drain to the core NMOS drain, wherein a first power rail has a voltage greater than the second power rail. Additional aspects include a first NMOS and an inverter having a gate oxide breakdown voltage of between 7 volts and 8 volts, and a core PMOS and a core NMOS having a gate oxide breakdown voltage of between 4 volts and 5 volts and between 3.5 volts and 4.5 volts, respectively, and wherein a first power rail has a voltage of 1.65 volts to 2 volts and a second power rail has a voltage of 0.8 volts to 1 volt. Further aspects include: providing a first RC clamp in a first domain for discharging current from an ESD event; coupling the first RC clamp to a first power rail and a first ground rail; providing a diode having an anode and a cathode connection; coupling the anode connection to the first ground rail; and coupling the cathode connection to a second ground rail, wherein current from an ESD event is discharged on a path from the first power rail to the second ground rail via the first RC clamp and the diode. Some aspects include: providing a second RC clamp in a second domain for discharging current from an ESD event; and coupling the second RC clamp to a second power rail and a second ground rail, wherein current from an ESD event is discharged on a path from a first power rail to the second power rail via a first RC clamp, a diode, and the second RC clamp. Additional aspects include a method wherein no leakage current from a first power rail to a second power rail flows through a blocking circuit when the first power rail is energized before the second power rail.

Another aspect of the present disclosure is a circuit including: a first domain including a first power clamp coupled to a first power rail and a first ground rail, and an I/O interface connection for sending signals from the first domain; a second domain including: a second power clamp coupled to a second power rail and a second ground rail; a core interface connection for transmitting signals to the second domain; a first core PMOS having a first core PMOS gate, a first core PMOS drain, and a first core PMOS source coupled to the second power rail; and a core NMOS having a core NMOS gate coupled to the first core PMOS gate and the core interface connection, a core NMOS drain coupled to the first core PMOS drain, and a core NMOS source coupled to the second ground rail; and a blocking circuit configured to block current from an ESD event having an input connection coupled to the I/O interface connection and an output connection coupled to the core interface connection, the blocking circuit including: a first NMOS having a first NMOS gate, a first NMOS drain, and a first NMOS source coupled to the first ground rail; a second NMOS having a second NMOS gate, a second NMOS drain, and a second NMOS source coupled to the first ground rail, wherein the input connection is coupled to the first NMOS gate, and to the second NMOS gate via an inverter, wherein the first NMOS and the inverter have a gate oxide breakdown voltage greater than a gate oxide breakdown voltage of the first core PMOS and the core NMOS; a second core PMOS having a second core PMOS gate, a second core PMOS drain, and a second core PMOS source coupled to the second power rail; and a third core PMOS having a third core PMOS gate, a third core PMOS drain, and a third core PMOS source coupled to the second power rail, wherein the first NMOS drain is coupled to the second core PMOS drain, and the third core PMOS gate, and wherein the output connection is coupled to the third core PMOS drain, the second NMOS drain, and the second core PMOS gate.

Some aspects include a circuit, wherein a first NMOS and an inverter have a gate oxide breakdown voltage of between 7 volts and 8 volts, and a first core PMOS and a core NMOS have a gate oxide breakdown voltage of between 4 volts and 5 volts and between 3.5 volts and 4.5 volts, respectively, and wherein a first power rail has a voltage of 1.65 volts to 2 volts and a second power rail has a voltage of 0.8 volts to 1 volt. Certain aspects include a diode having an anode coupled to a first ground rail and a cathode coupled to a second ground rail, wherein a first domain further includes a first RC clamp coupled to a first power rail and the first ground rail, wherein a second domain further includes a second RC clamp coupled to a second power rail and the second ground rail, wherein current from an ESD event is discharged on a path from the first power rail to the second ground rail via the first RC clamp and the diode or on a path from the first power rail to the second power rail via the first RC clamp, the diode, and the second RC clamp. Other aspects include a circuit, wherein no leakage current from a first power rail to a second power rail flows through I/O and core interface connections when the first power rail is energized before the second power rail.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves problem of transistor gate oxide breakdown attendant upon ESD zapping in circuits with multiple power domains including cross-domain interface circuits. The present disclosure addresses and solves such problems, for instance, by, inter alia, providing a blocking circuit for blocking ESD discharge current between power domains, thereby preventing gate oxide breakdown of vulnerable transistors (e.g., that are coupled to the ESD transistor) in a cross-domain circuit.

Figure 1:
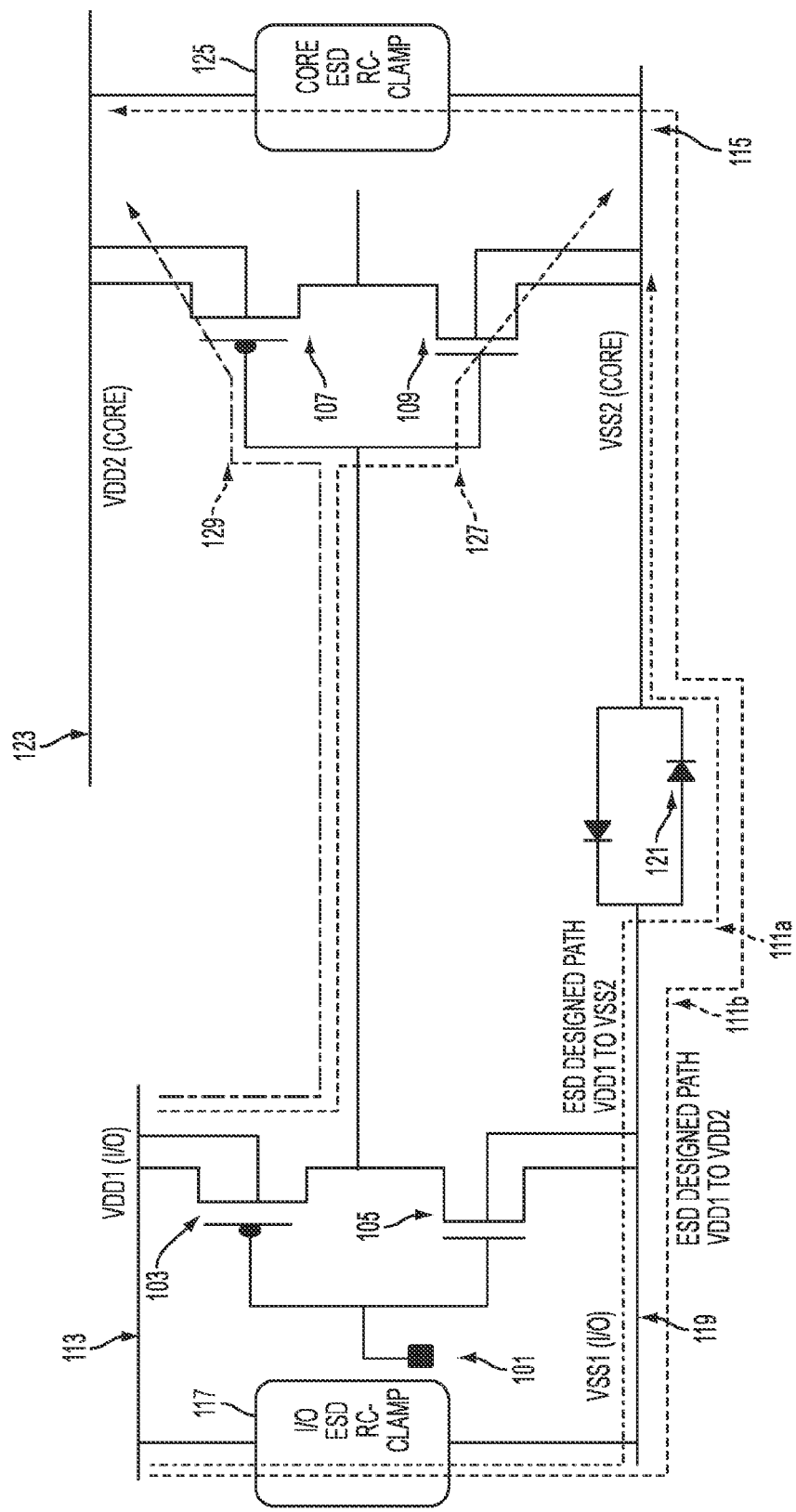
FIG. 1 schematically illustrates a circuit that includes a traditional cross-domain ESD protection scheme.
Figure 2:
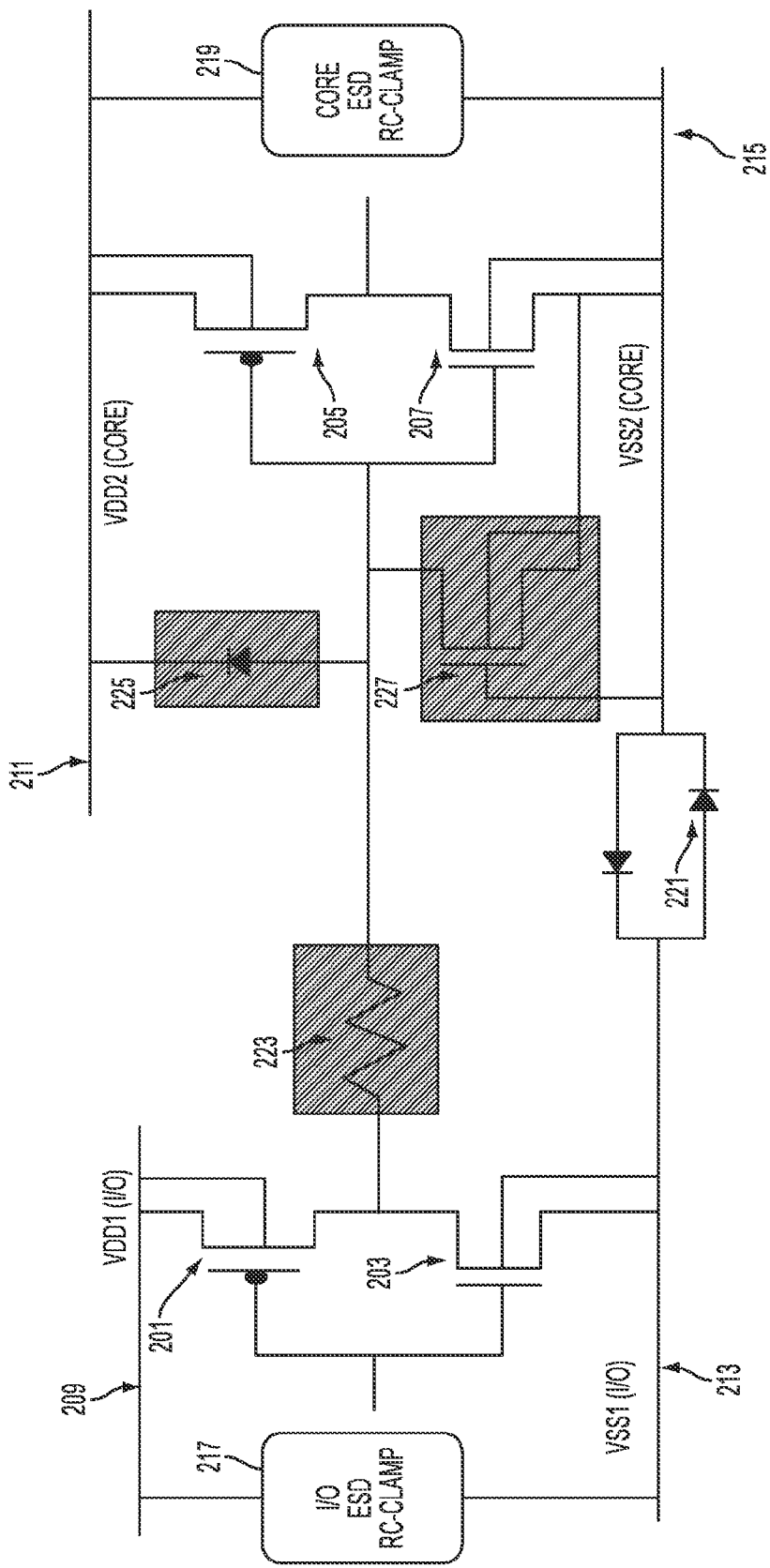
FIG. 2 schematically illustrates a common solution for the problems of a traditional cross-domain ESD protection scheme.
Figure 3:
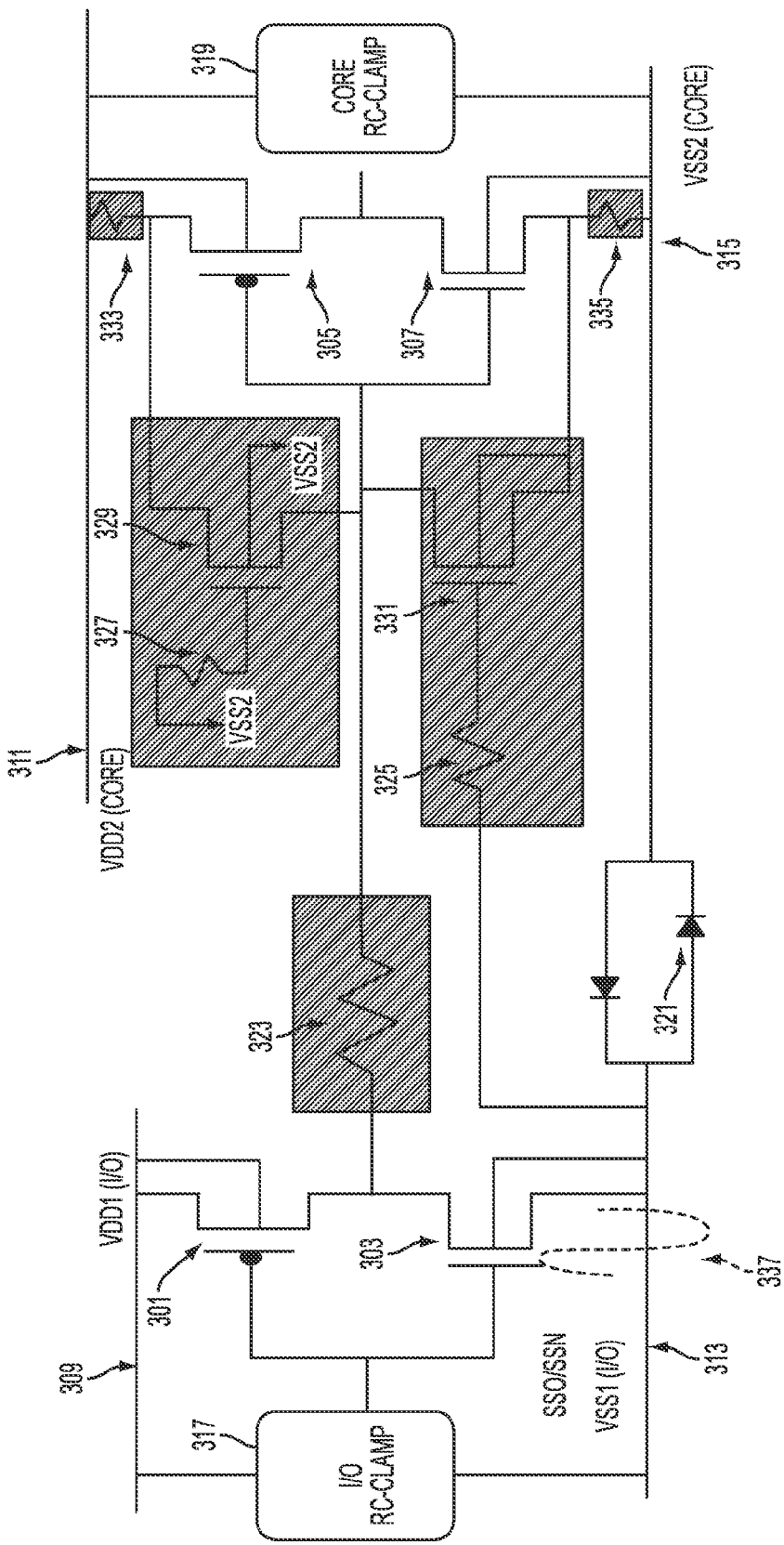
FIG. 3 schematically illustrates another solution for the problems of a traditional cross-domain ESD protection scheme.
Figure 4A:
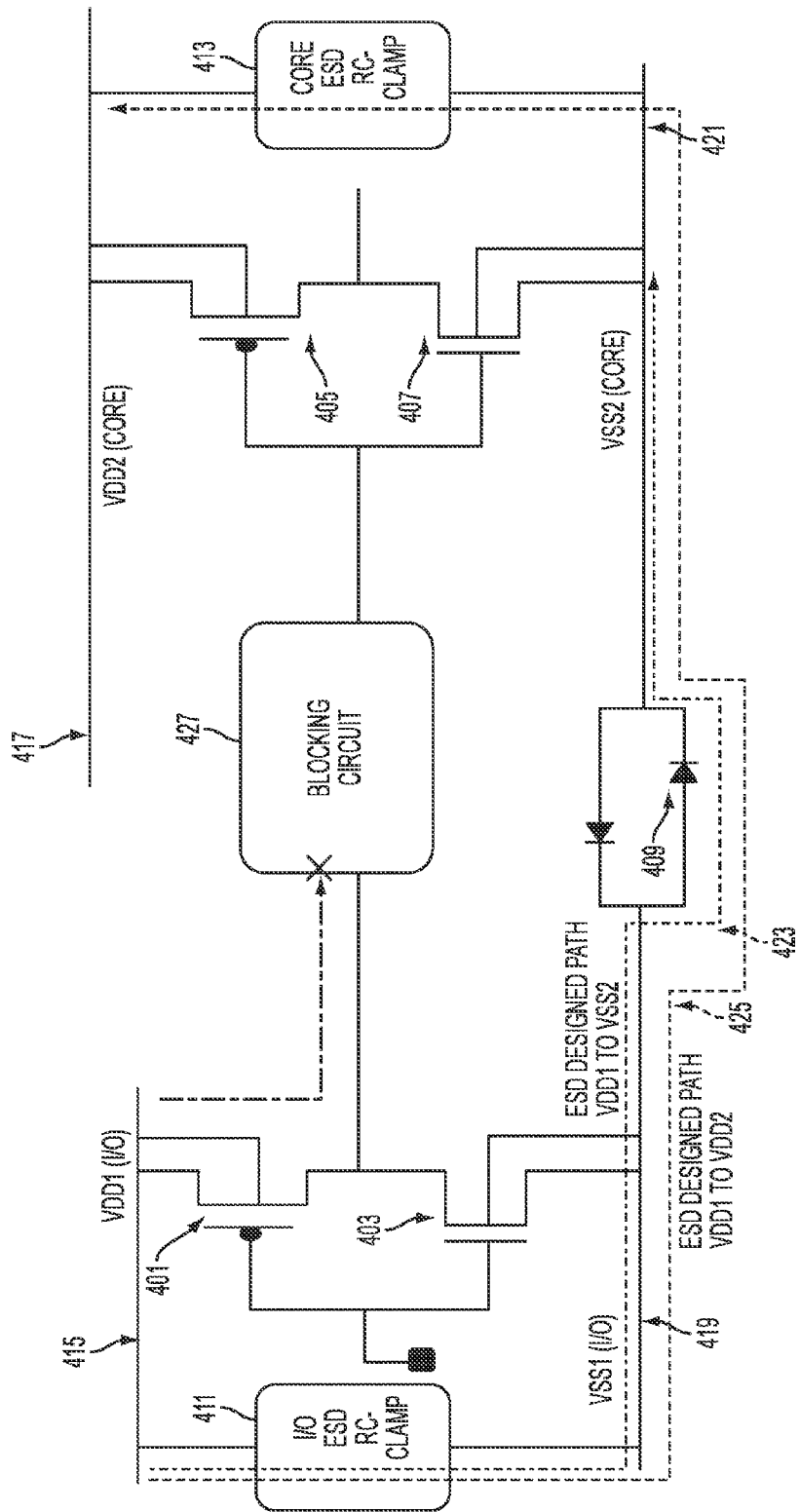
FIGS. 4A and 4B schematically illustrate circuits implementing ESD protection schemes for multiple power domains, in accordance with an exemplary embodiment of the present disclosure.
Figure 4B:
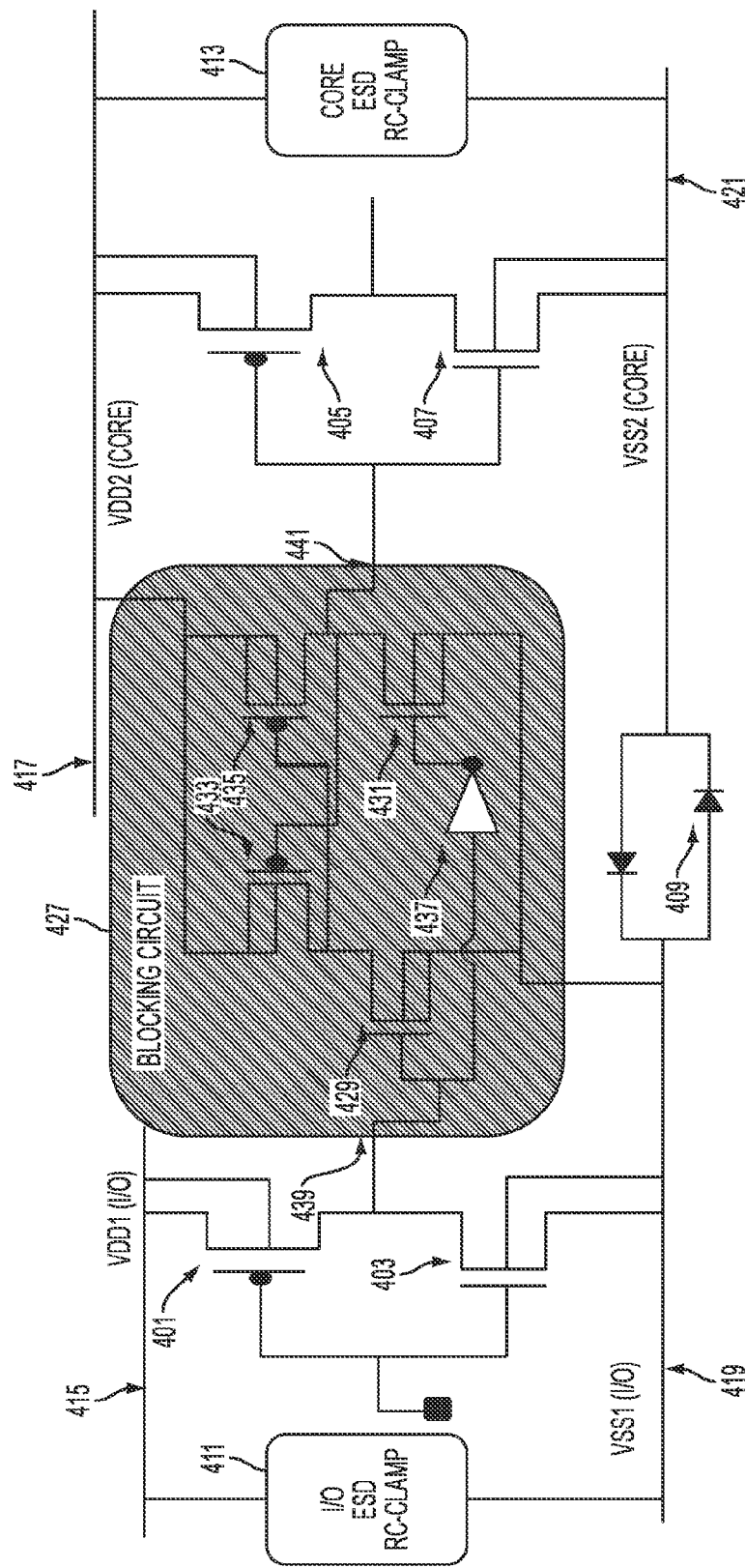

FIGS. 4A and 4B schematically illustrate circuits implementing ESD protection schemes for multiple power domains, in accordance with an exemplary embodiment of the present disclosure. For example, the circuit shown in FIG. 4A (e.g., including transistors 401, 403, 405, and 407, diodes 409, RC clamps 411 and 413, power rails 415 and 417 (e.g., VDD1 and VDD2), and ground rails 419 and 421 (e.g., VSS1 and VSS2), among other components, arranged similar to corresponding components of FIG. 1) implements paths 423 and 425. As shown, path 423 (e.g., from power rail 415 to ground rail 421) includes RC clamp 411 and diodes 409, and path 425 (e.g., from power rail 415 to power rail 417) includes RC clamps 411 and 413, and diodes 409.

Adverting to FIG. 4A, under cross-domain VDD1 to VSS2 ESD zapping, the purpose may, for instance, include preventing gate oxide breakdown of transistor 407. During the ESD event, blocking circuit 427 prevents ESD current from the ESD event from flowing through one or more traditional design paths (e.g., design path 111a from FIG. 1). Similarly, under cross-domain VDD1 to VDD2 ESD zapping, the purpose may, for instance, include preventing gate oxide breakdown of transistor 405. Blocking circuit 427 prevents ESD current from the ESD event from flowing through another one or more traditional design paths (e.g., design path 127 or 129 from FIG. 1).

The circuit shown in FIG. 4B illustrates a circuit implementing a blocking circuit for blocking ESD discharge current between power domains. As shown, the blocking circuit 427 includes NMOS 429 and 431 with sources coupled to ground rail 419, core PMOS 433 and 435 with sources coupled to power rail 417, and inverter 437. An input connection 439 is coupled to a gate of the NMOS 429, and to a gate of the NMOS 431 gate via the inverter 437. Additionally, a drain of the NMOS 429 is coupled to a drain of the core PMOS 433, and a gate of the core PMOS 435. Further, an output connection 441 is coupled to a drain of the core PMOS 435, a drain of the NMOS 431, and a gate of the core PMOS 433.

In addition to protecting the gate oxides of transistors 405 and 407, the ESD protection schemes of FIGS. 4A and 4B do not require a power-on sequence, since the sources of core PMOS 433 and 435 are coupled to power rail 417. There is also a significant size reduction in circuits that implement the ESD protection schemes of FIGS. 4A and 4B, since extra resistors (e.g., resistors 323, 325, and 327, source pump resistors 333 and 335, etc.) that take up a significant amount of chip area are not necessary for these schemes. Moreover, as indicated, these schemes complement high-speed I/O applications (e.g., there are no source pump resistors 333 and 335 that reduce the speed of such applications). Furthermore, ground bounce and false triggering are not a concern because the sources of NMOS 429 and 431 are coupled to ground rail 419. Thus, the ESD protection schemes of FIGS. 4A and 4B will not experience distortion of the core output function as a result of noise on ground rail 419.

The embodiments of the present disclosure can achieve several technical effects, including gate oxide protection of vulnerable MOSFET transistors, high-speed I/O applications, design simplicity, and reduced device (and circuit) size. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or any device utilizing logic or high-voltage technology nodes. The present disclosure therefore enjoys industrial applicability in any of various types of highly integrated semiconductor devices, including devices that use ESD protection devices to pass ESD/Latch-up standards specifications (e.g., liquid crystal display (LCD) drivers, synchronous random access memories (SRAM), One Time Programming (OTP), and power management products).

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A circuit comprising:
   a first domain comprising a first power clamp coupled to a first power rail and a first ground rail, and a first interface connection configured to transmit signals from the first domain;
   a second domain comprising a second power clamp coupled to a second power rail and a second ground rail, and a second interface connection configured to receive signals into the second domain; and
   a blocking circuit for blocking current from an ESD event, the blocking circuit having an input connection coupled to the first interface connection and an output connection coupled to the second interface connection, wherein the blocking circuit comprises a first NMOS having a first NMOS gate coupled to the input connection, a first NMOS drain, and a first NMOS source coupled to the first ground rail.

2. The circuit according to claim 1, wherein the blocking circuit further comprises:
   a second NMOS having a second NMOS gate, a second NMOS drain, and a second NMOS source coupled to the first ground rail; and
   an inverter having an input coupled to the input connection and the first NMOS gate, and having an output coupled to the second NMOS gate.

3. The circuit according to claim 2, wherein the blocking circuit further comprises:
   a first core PMOS having a first core PMOS gate, a first core PMOS drain, and a first core PMOS source coupled to the second power rail; and
   a second core PMOS having a second core PMOS gate, a second core PMOS drain, and a second core PMOS source coupled to the second power rail, wherein the first NMOS drain is coupled to the first core PMOS drain and the second core PMOS gate, and wherein the output connection is coupled to the second core PMOS drain, the second NMOS drain, and the first core PMOS gate.

4. The circuit according to claim 2, wherein the second domain further comprises a core PMOS having a core PMOS gate, a core PMOS drain, and a core PMOS source coupled to the second power rail; and a core NMOS having a core NMOS gate coupled to the core PMOS gate and the second interface connection, a core NMOS drain coupled to the core PMOS drain, and a core NMOS source coupled to the second ground rail, wherein the first NMOS and the inverter have a gate oxide breakdown voltage greater than a gate oxide breakdown voltage of the core PMOS and the core NMOS, and wherein the first power rail has a voltage greater than the second power rail.

5. The circuit according to claim 4, wherein the first NMOS and the inverter have a gate oxide breakdown voltage of between 7 volts and 8 volts, and the core PMOS and the core NMOS have a gate oxide breakdown voltage of between 4 volts and 5 volts and between 3.5 volts and 4.5 volts, respectively, and wherein the first power rail has a voltage of 1.65 volts to 2 volts and the second power rail has a voltage of 0.8 volts to 1 volt.

6. The circuit according to claim 1, further comprising:
   a first RC clamp coupled to the first power rail and the first ground rail; and
   a diode having an anode coupled to the first ground rail and a cathode coupled to the second ground rail, wherein current from an ESD event is discharged on a path from the first power rail to the second ground rail via the first RC clamp and the diode.

7. The circuit according to claim 6, further comprising a second RC clamp coupled to the second power rail and the second ground rail, wherein current from an ESD event is discharged on a path from the first power rail to the second power rail via the first RC clamp, the diode, and the second RC clamp.

8. The circuit according to claim 1, wherein no leakage current from the first power rail to the second power rail flows through the blocking circuit when the first power rail is energized before the second power rail.

9. A method comprising:
coupling a first power clamp to a first power rail and a first ground rail of a first domain;
coupling a second power clamp to a second power rail and a second ground rail of a second domain;
providing a blocking circuit for blocking current from an ESD event;
providing in the blocking circuit a first NMOS transistor having a first NMOS source, a first NMOS drain, and a first NMOS gate;
coupling the first NMOS source to the first ground rail;
providing an I/O interface connection in the first domain for transmitting signals from the first domain to the blocking circuit;
providing a core interface connection in the second domain for transmitting signals from the blocking circuit to the second domain;
coupling an input connection of the blocking circuit to the I/O interface connection;
coupling the first NMOS gate to the input connection; and
coupling an output connection of the blocking circuit to a core interface connection.

10. The method according to claim 9, further comprising:
providing in the blocking circuit a second NMOS transistor having a second NMOS source, a second NMOS drain, and a second NMOS gate;
coupling the second NMOS source to the first ground rail;
providing an inverter in the blocking circuit;
coupling an output of the inverter to the second NMOS gate; and
coupling an input of the inverter to the first NMOS gate and the input connection.

11. The method according to claim 10, further comprising:
providing in the blocking circuit a first core PMOS transistor having a first core PMOS source, a first core PMOS drain, and a first core PMOS gate;
coupling the first core PMOS source to the second power rail;
providing in the blocking circuit a second core PMOS transistor having a second core PMOS source, a second core PMOS drain, and a second core PMOS gate;
coupling the second core PMOS source to the second power rail;
coupling the first NMOS drain to the first core PMOS drain, and to the second core PMOS gate; and
coupling the second NMOS drain to the second core PMOS drain, the first core PMOS gate, and to the output connection.

12. The method according to claim 10, further comprising:
providing in the second domain a core PMOS transistor having a core PMOS source, a core PMOS drain, and a core PMOS gate, the core PMOS transistor having a gate oxide breakdown voltage less than a gate oxide breakdown voltage of the first NMOS and of the inverter;
coupling the core PMOS source to the second power rail;
providing in the second domain a core NMOS transistor having a core NMOS source, a core NMOS drain, and a core NMOS gate, the core NMOS transistor having a gate oxide breakdown voltage less than the gate oxide breakdown voltage of the first NMOS and of the inverter;
coupling the core NMOS source to the second ground rail;
coupling the core NMOS gate, the core NMOS gate and the output connection; and
coupling the core NMOS drain to the core NMOS drain, wherein the first power rail has a voltage greater than the second power rail.

13. The method according to claim 12, wherein the first NMOS and the inverter have a gate oxide breakdown voltage of between 7 volts and 8 volts, and the core PMOS and the core NMOS have a gate oxide breakdown voltage of between 4 volts and 5 volts and between 3.5 volts and 4.5 volts, respectively, and wherein the first power rail has a voltage of 1.65 volts to 2 volts and the second power rail has a voltage of 0.8 volts to 1 volt.

14. The method according to claim 9, further comprising:
providing a first RC clamp in the first domain for discharging current from an ESD event;
coupling the first RC clamp to the first power rail and the first ground rail;
providing a diode having an anode and a cathode connection;
coupling the anode connection to the first ground rail; and
coupling the cathode connection to the second ground rail, wherein current from an ESD event is discharged on a path from the first power rail to the second ground rail via the first RC clamp and the diode.

15. The method according to claim 14, further comprising:
providing a second RC clamp in the second domain for discharging current from an ESD event; and
coupling the second RC clamp to the second power rail and the second ground rail, wherein current from an ESD event is discharged on a path from the first power rail to the second power rail via the first RC clamp, the diode, and the second RC clamp.

16. The method according to claim 9, wherein no leakage current from the first power rail to the second power rail flows through the blocking circuit when the first power rail is energized before the second power rail.

17. A circuit comprising:
a first domain comprising a first power clamp coupled to a first power rail and a first ground rail, and an I/O interface connection for sending signals from the first domain;
a second domain comprising:
a second power clamp coupled to a second power rail and a second ground rail;
a core interface connection for transmitting signals to the second domain;
a first core PMOS having a first core PMOS gate, a first core PMOS drain, and a first core PMOS source coupled to the second power rail; and
a core NMOS having a core NMOS gate coupled to the first core PMOS gate and the core interface connection, a core NMOS drain coupled to the first core PMOS drain, and a core NMOS source coupled to the second ground rail; and
a blocking circuit configured to block current from an ESD event having an input connection coupled to the I/O interface connection and an output connection coupled to the core interface connection, the blocking circuit comprising:

a first NMOS having a first NMOS gate, a first NMOS drain, and a first NMOS source coupled to the first ground rail;

a second NMOS having a second NMOS gate, a second NMOS drain, and a second NMOS source coupled to the first ground rail, wherein the input connection is coupled to the first NMOS gate, and to the second NMOS gate via an inverter, wherein the first NMOS and the inverter have a gate oxide breakdown voltage greater than a gate oxide breakdown voltage of the first core PMOS and the core NMOS;

a second core PMOS having a second core PMOS gate, a second core PMOS drain, and a second core PMOS source coupled to the second power rail; and a third core PMOS having a third core PMOS gate, a third core PMOS drain, and a third core PMOS source coupled to the second power rail, wherein the first NMOS drain is coupled to the second core PMOS drain, and the third core PMOS gate, and wherein the output connection is coupled to the third core PMOS drain, the second NMOS drain, and the second core PMOS gate.

18. The circuit according to claim 17, wherein the first NMOS and the inverter have a gate oxide breakdown voltage of between 7 volts and 8 volts, and the first core PMOS and the core NMOS have a gate oxide breakdown voltage of between 4 volts and 5 volts and between 3.5 volts and 4.5 volts, respectively, and wherein the first power rail has a voltage of 1.65 volts to 2 volts and the second power rail has a voltage of 0.8 volts to 1 volt.

19. The circuit according to claim 17, further comprising a diode having an anode coupled to the first ground rail and a cathode coupled to the second ground rail, wherein the first domain further comprises a first RC clamp coupled to the first power rail and the first ground rail, wherein the second domain further comprises a second RC clamp coupled to the second power rail and the second ground rail, wherein current from an ESD event is discharged on a path from the first power rail to the second ground rail via the first RC clamp and the diode or on a path from the first power rail to the second power rail via the first RC clamp, the diode, and the second RC clamp.

20. The circuit according to claim 17, wherein no leakage current from the first power rail to the second power rail flows through the I/O and core interface connections when the first power rail is energized before the second power rail.

* * * * *